(12) United States Patent
Yu

(10) Patent No.: US 7,834,677 B2
(45) Date of Patent: Nov. 16, 2010

(54) TRANSMISSION GATE WITH BODY EFFECT COMPENSATION CIRCUIT

(75) Inventor: Ching-jung Yu, Chiayi (TW)

(73) Assignee: Genesys Logic, Inc., Shindian (TW)

( * ) Notice: Subject to any disclaimer, the term of this patent is extended or adjusted under 35 U.S.C. 154(b) by 291 days.

(21) Appl. No.: 12/205,523

(22) Filed: Sep. 5, 2008

(65) Prior Publication Data

US 2009/0315118 A1 Dec. 24, 2009

(51) Int. Cl.
*H03K 17/0412* (2006.01)
(52) U.S. Cl. ...................................... 327/391; 327/534
(58) Field of Classification Search ................. 327/391, 327/534
See application file for complete search history.

*Primary Examiner*—Evan Pert

(74) *Attorney, Agent, or Firm*—Kirton & McConkie; Evan R. Witt

(57) ABSTRACT

A transmission gate circuit includes a first PMOS device, a first NMOS device, a second PMOS device, a second NMOS device, and a third transistor. A gate electrode, a first electrode and a second electrode of the first PMOS device are coupled to a first control signal, an input end, and an output end, respectively. A gate electrode, a first electrode and a second electrode of the first NMOS device are coupled to a second control signal, the input end, and the output end, respectively. A gate electrode, a first electrode and a second electrode of the second PMOS device are coupled to the first control signal, an input end, and a body electrode of the first PMOS device, respectively. A gate electrode, a first electrode, and a second electrode of the second NMOS device are coupled to the second control signal, a body electrode of the first PMOS device, and the output end, respectively. A gate electrode, a first electrode and a second electrode of the third PMOS device are coupled to a second control signal, a first supply voltage, and the body electrode of the first PMOS device, respectively.

7 Claims, 10 Drawing Sheets

TRANSMISSION GATE WITH BODY EFFECT COMPENSATION CIRCUIT

BACKGROUND OF THE INVENTION

1. Field of the Invention

The present invention relates to a transmission gate circuit, and more particularly, to a transmission gate circuit capable of compensating body effect.

2. Description of the Related Art

In Integrated circuit (IC) field, a transmission gate functions as a switch to determine whether signal passes or not.

Please refer to FIG. 1 illustrating a circuit diagram of a conventional transmission gate circuit 10. The transmission gate circuit 10 comprises a P-type metal oxide semiconductor (PMOS) P1 controlled by a control signal C, and an N-type metal oxide semiconductor (NMOS) N1 controlled by a control signal C' inversed to the control signal C. As the control signal C is at high voltage level, the transmission gate circuit 10 turns off, so that output Y is floating. Conversely, the control signal C is at low voltage level, the transmission gate circuit 10 turns on, so that input X is delivered to output Y However, a threshold voltage $V_{THp}$ of the PMOS device P1 is as a function of $V_{THp} = V_{THp0} +$ $$\gamma\left(\sqrt{|2\Phi_F| + |V_{SB}|} - \sqrt{|2\Phi_F|}\right),$$

and a threshold voltage $V_{THn}$ of the NMOS device N1 is as a function of $V_{THn} = V_{THn0} +$ $$\gamma\left(\sqrt{|2\Phi_F| + V_{SB}} - \sqrt{|2\Phi_F|}\right),$$

where $V_{SB}$ represents voltage difference between source and body, $V_{THp0}$, $V_{THn0}$ represents threshold voltage measured without body effect, $\gamma$ is a coefficient associated with the body effect, and $\Phi_F$ indicates to Fermi potential. Therefore, an existence of voltage difference $V_{SB}$ varies the actual threshold voltage. As an example of NMOS element, a large voltage difference $V_{SB}$ may rise the threshold voltage $V_{THn}$ from 0.8V to 1.6V, i.e. almost twice. Such body effect, that is a rise of the threshold voltage, degrades conductivity of current as well as slows operation of the MOS circuit.

Although a use of the PMOS device P1 and the NMOS device N1 in the transmission gate circuit 10 stables and balances a turn-on resistor over a wide range of input voltage, respective body effects for the MOS elements P1 and N1 still cause an uneven turn-on resistor under a higher or lower range of input voltage.

SUMMARY OF THE INVENTION

Briefly summarized, the present invention provides a transmission gate. The transmission comprises a first PMOS device of which a gate, a drain, and a source are coupled to a first control signal, an input end, and an output end, respectively; a first NMOS device of which a gate, a drain, and a source are coupled to a second control signal, the input end, and the output end, respectively; a second PMOS device of which a gate, a drain, and a source are coupled to the first control signal OE, the input end, and a bulk of the first PMOS device, respectively; a second NMOS device of which a gate, a drain, and a source are coupled to the second control signal, the bulk of the first PMOS device, and output end, respectively; and a third PMOS device, of which a gate, a drain, and a source are coupled to the second control signal, a first supply voltage, and the bulk of the first PMOS device, respectively.

In another aspect of the present invention, the transmission gate circuit further comprises a fourth PMOS device of which a gate, a drain and a source are coupled to the first control signal, the input end and a bulk of the first NMOS device, respectively; a third NMOS device, of which a gate, a drain, and a source of the third NMOS device are coupled to the second control signal, the bulk of the first NMOS device, and output end B, respectively; and a fourth NMOS device, of which a gate, a drain, and a source of the fourth NMOS device are coupled to the first control signal, the bulk of the first NMOS device N1, and a second supply voltage, respectively.

According to the present invention, both the source and a bulk of the second PMOS device are coupled.

According to the present invention, both the source and a bulk of the second PMOS device are coupled, and a bulk of the fourth PMOS device is coupled to the bulk of the second PMOS device.

According to the present invention, a bulk of the second NMOS device, the drain and a bulk of the third NMOS device are coupled to a bulk of the first NMOS device.

According to the present invention, a bulk of the fourth PMOS device, a source and a bulk of the second NMOS device are coupled to the bulk of the first PMOS device.

The present invention will be described with reference to the accompanying drawings, which show exemplary embodiments of the present invention.

BRIEF DESCRIPTION OF THE DRAWINGS

FIG. 3 shows a signal diagram of input end A, output end B, and node P, when the transmission gate circuit turns on.

DETAILED DESCRIPTION OF THE INVENTION

Figure 1:
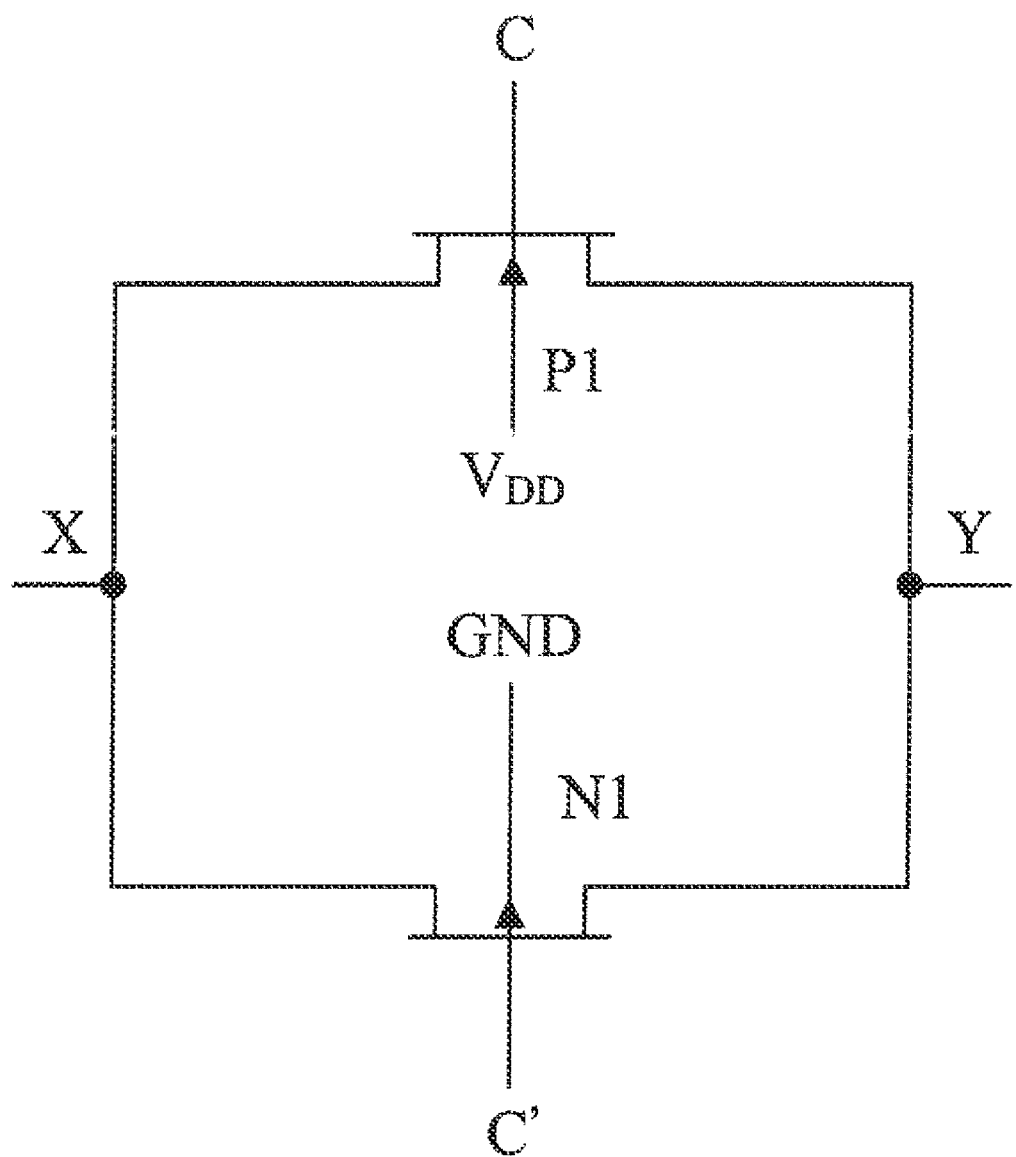
FIG. 1 illustrates a circuit diagram of a conventional transmission gate circuit.
Figure 2:
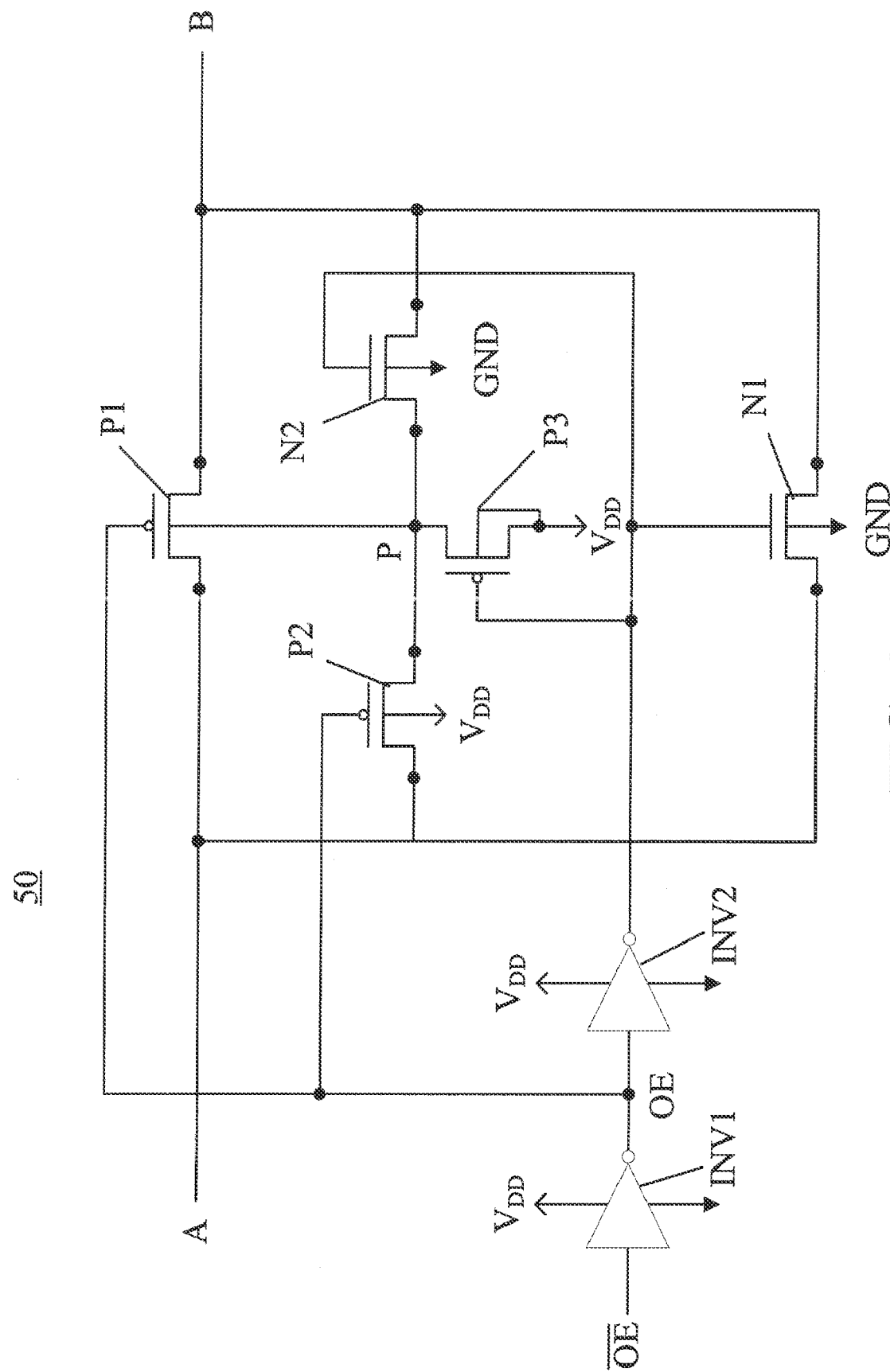
FIG. 2 depicts a circuit diagram of a transmission gate circuit according to a first embodiment of the present invention.

Please refer to FIG. 2, which depicts a circuit diagram of a transmission gate circuit 50 according to a preferred embodiment of the present invention. The transmission gate circuit 50 comprises a first P-type metal oxide semiconductor (PMOS) device P1, a first N-type metal oxide semiconductor (NMOS) device N1, a second PMOS device P2, a second NMOS device N2, and a third PMOS device P3. An inverter INV1 is used for inverting a second control signal $\overline{OE}$ to output a first control signal OE, and the inverter INV2 is used for inverting the first control signal OE to generate the second control signal $\overline{OE}$. A gate, a drain, and a source of the first PMOS device P1 are coupled to the first control signal OE, the input end A, and output end B, respectively. A gate, a drain, and a source of the first NMOS device N1 are coupled to the second control signal $\overline{OE}$, the input end A, and output end B, respectively. A gate, a drain, and a source of the second PMOS device P2 are coupled to the first control signal OE, the input end A, and a bulk of the first PMOS device P1, respectively. A gate, a drain, and a source of the second NMOS device N2 are coupled to the second control signal $\overline{OE}$, the bulk of the first PMOS device P1, and output end B, respectively. A gate, a drain, and a source of the third PMOS device P3 are coupled to the second control signal $\overline{OE}$, a first supply voltage $V_{DD}$, and the bulk of the first PMOS device P1, respectively.

That input signal at input end A delivers to the output end B through the PMOS device P1 and the NMOS device N1 relies on on/off states of the transmission gate circuit 50 according to logical voltage of the control signal $\overline{OE}$.

When the control signal $\overline{OE}$ is at low logical voltage level (while the control signal OE is at high logical voltage level), the PMOS devices P1, P2 and NMOS devices N1, N2 are turned off, but the PMOS device P3 turns on. Meanwhile, N-well of the PMOS device P1 is coupled the first supply voltage $V_{DD}$. In this interval, the input signal at the input end A of the transmission gate circuit 50 fails to deliver to the output end B.

Figure 3:
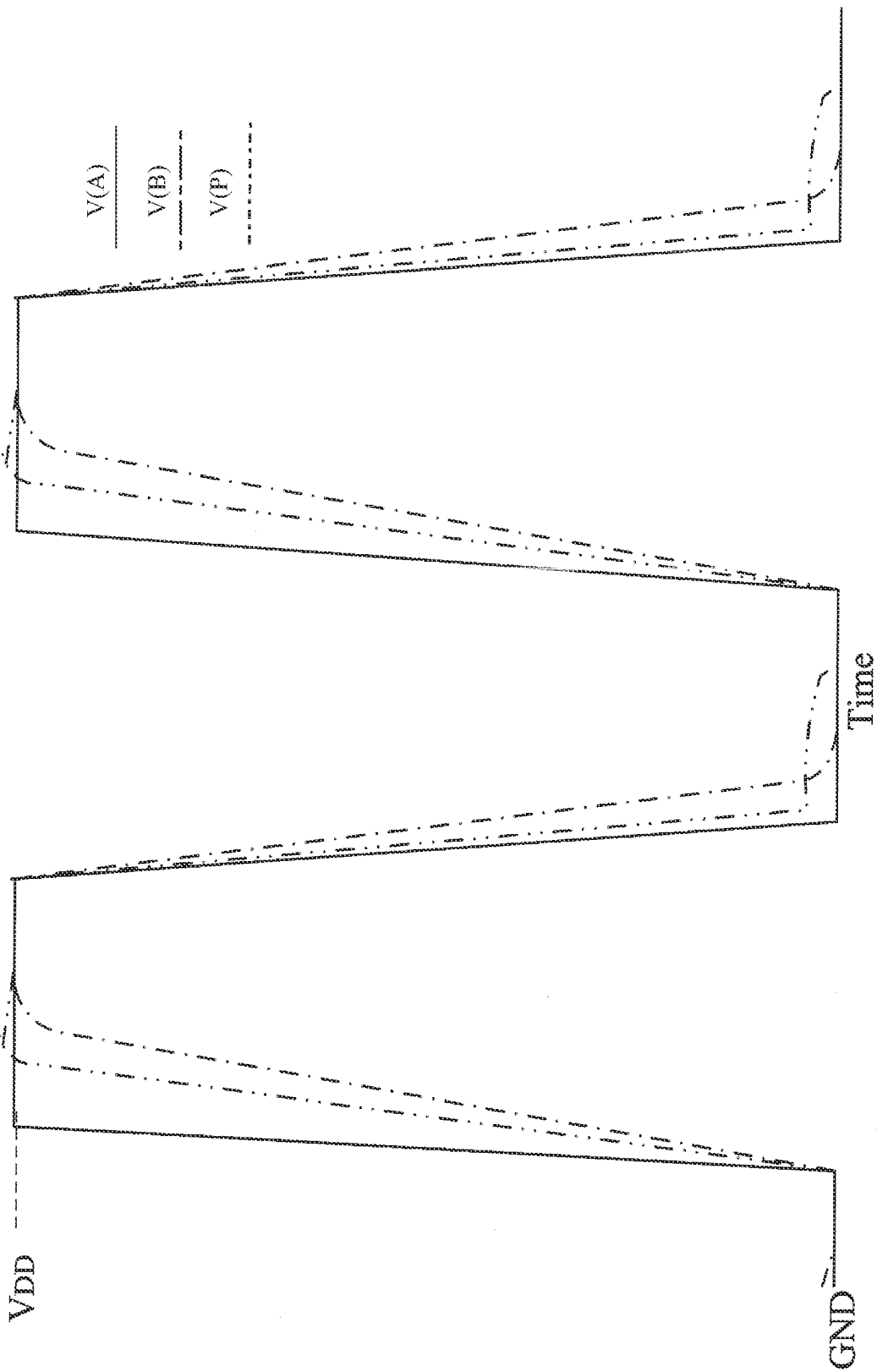
Figure 4:
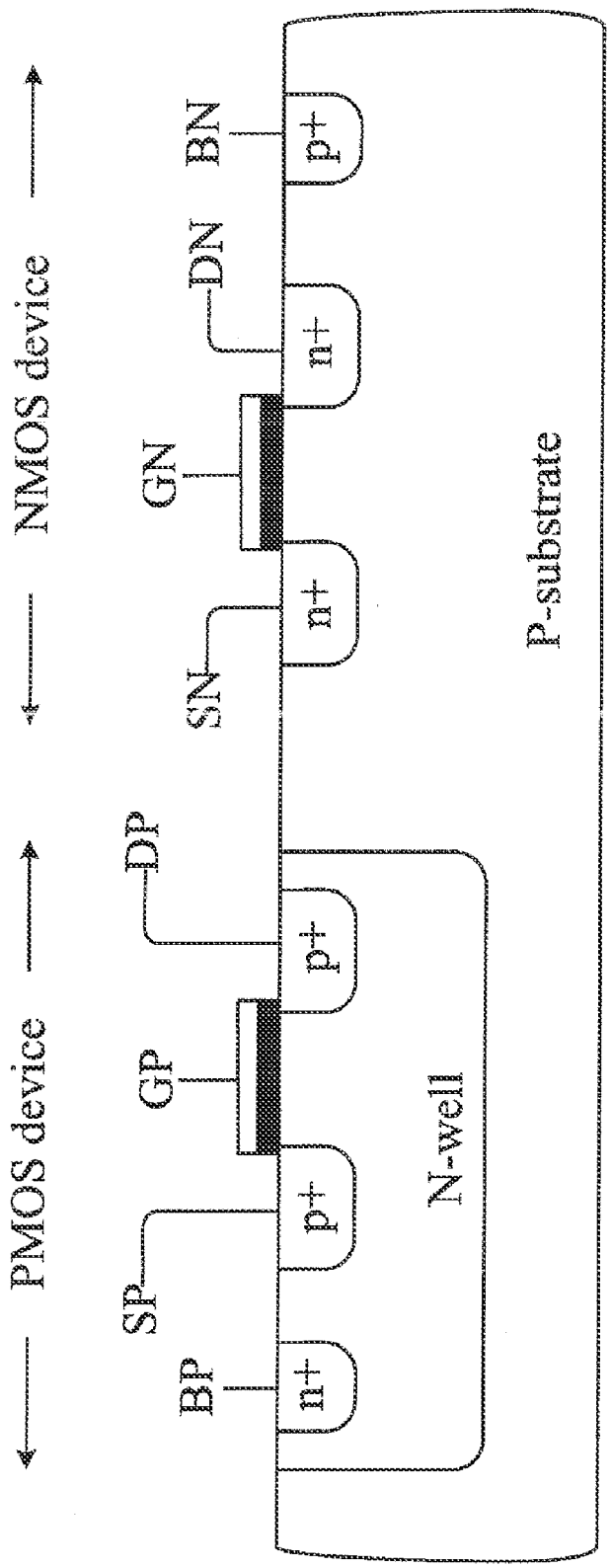
FIG. 4 shows a structure of the PMOS device and the NMOS device of the transmission gate circuit.

Please refer to FIG. 3 showing a signal diagram of input end A, output end B, and node P when the transmission gate circuit turns on, and FIG. 4 shows a structure of the PMOS device and the NMOS device of the transmission gate circuit. When the control signal $\overline{OE}$ is at high logical voltage level (while the control signal OE is at low logical voltage level), three states of the transmission gate circuit 50 happen:

(A) When the input signal is at high logical voltage level, the PMOS device P3 and NMOS device N2 are turned off, but the PMOS device P1 and the NMOS device N1 turns on, so that voltage of the input end A is delivered to N-well (i.e. bulk) of PMOS device P1 through the PMOS device P2. Therefore, voltage difference $|V_{SB}|$ between the bulk and the source of the PMOS device P1 is too small to ignore body effects on the PMOS device P1.

(B) The PMOS device P3 turns off while the PMOS devices P1, P2 and the NMOS devices N1, N2 turn on, in response to a rise of the input signal from the low logical voltage level to the high logical voltage level, or a drop of the input signal from the high logical voltage level to the low logical voltage level. As a result, voltages of the input end A and the output end B are delivered to N-well (i.e. bulk) of PMOS device P1 through the PMOS device P2 and the NMOS device N2. Therefore, voltage difference $|V_{SB}|$ between the bulk and the source of the PMOS device P1 is too small to ignore body effects on the PMOS device P1.

(C) The PMOS device P2, P3 turns off whereas the PMOS devices P1 and the NMOS device N1 turn on, when the input signal is at the low logical voltage level. In this way, voltage of the output end B is delivered to N-well (i.e. bulk) of PMOS device P1 through the NMOS device N2. Therefore, voltage difference $|V_{SB}|$ between the bulk and the source of the PMOS device P1 is too small to ignore body effects on the PMOS device P1.

Consequently, during a time period of which the control signal $\overline{OE}$ is at high logical voltage level (while the control signal OE is at the low logical voltage level), transmission gate circuit 50 is capable of reducing body effect of the PMOS device.

It is noted that a variation of the bulk voltage of the PMOS device P1 relates to a parasitic capacitor on the node P or a turn-on resistor of the NMOS device N2 or the PMOS device P2, and results in a propagation delay of the voltage on node P in contrast to input signal on input end A.

Figure 5:
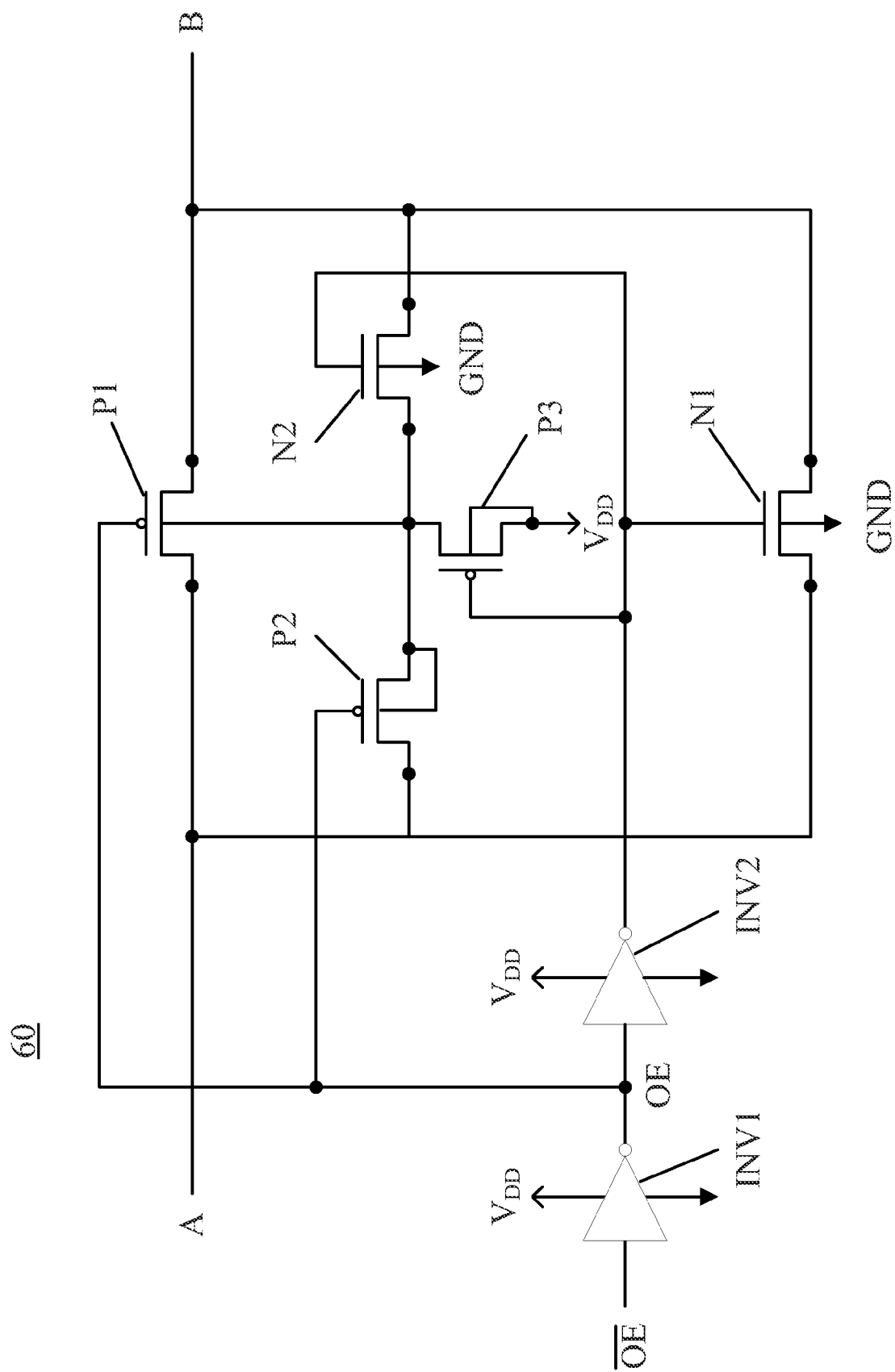
FIG. 5 illustrates a circuit diagram of the transmission gate circuit according to a second embodiment of the present invention.

Please refer to FIG. 5 illustrates a circuit diagram of the transmission gate circuit 60 according to a second embodiment of the present invention. Differing from the transmission gate circuit 50 shown in FIG. 2, the N-well of the PMOS device P2 is coupled to that of the PMOS device P1 in the transmission gate circuit 60 in FIG. 5. In other words, a bulk of the PMOS device P2 coupled to that of the PMOS device P1 also achieves a reduction of body effect.

Figure 6:
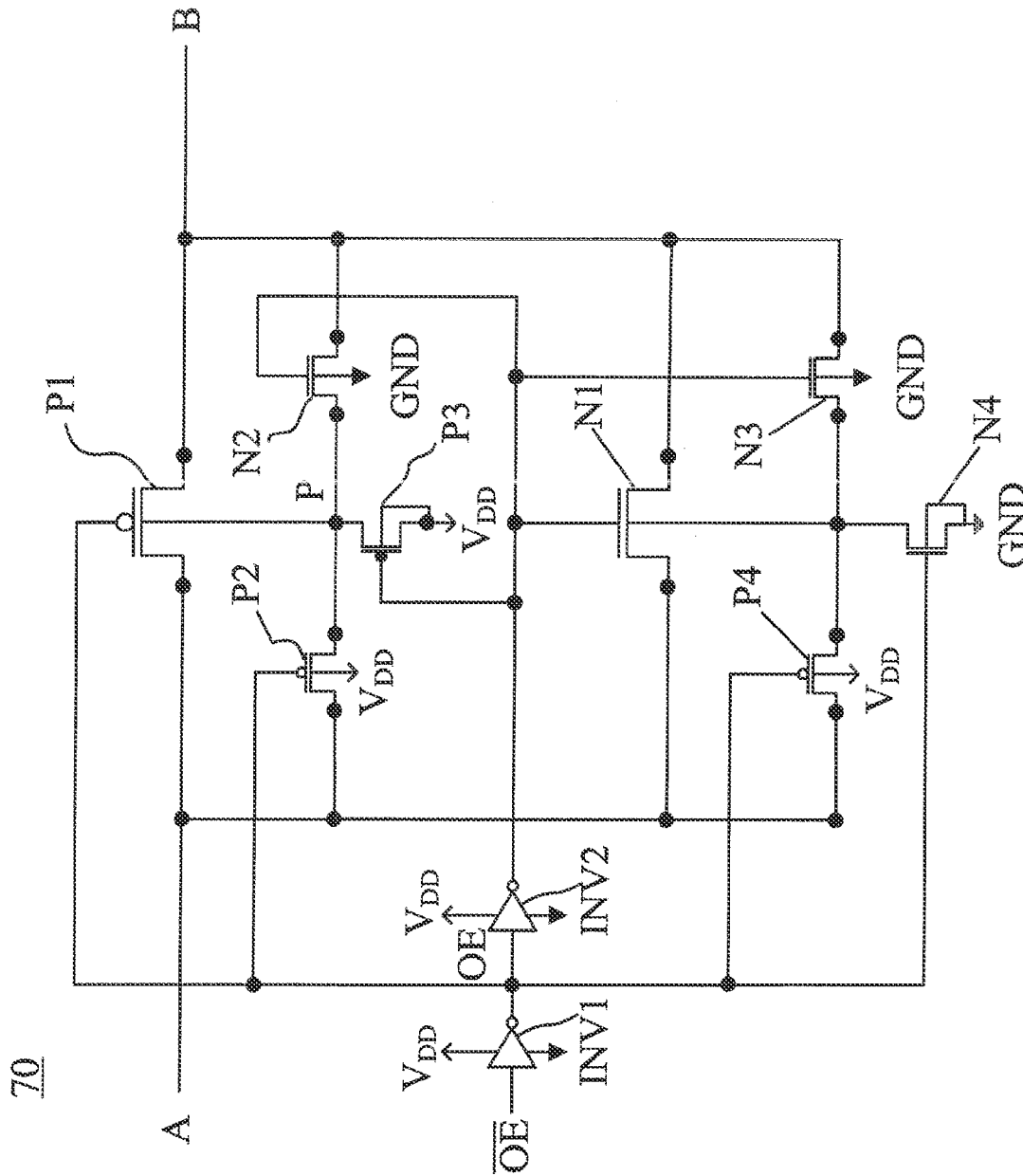
FIG. 6 illustrates a circuit diagram of the transmission gate circuit according to a third embodiment of the present invention.

Please refer to FIG. 6 showing a transmission gate circuit 70 according to a third embodiment of the present invention. The transmission gate circuit 50 comprises a first P-type metal oxide semiconductor (PMOS) device P1, a first N-type metal oxide semiconductor (NMOS) device N1, a second PMOS device P2, a second NMOS device N2, a third PMOS device P3, a third NMOS device N3, a fourth PMOS P4, and a fourth PMOS P4. An inverter INV1 is used for inverting a second control signal $\overline{OE}$ to output a first control signal OE, and the inverter INV2 is used for inverting the first control signal OE to generate the second control signal $\overline{OE}$. A gate, a drain, and a source of the first PMOS device P1 are coupled to the first control signal OE, the input end A, and output end B, respectively. A gate, a drain, and a source of the first NMOS device N1 are coupled to the second control signal $\overline{OE}$, the input end A, and output end B, respectively. A drain, and a source of the second PMOS device P2 are coupled to the input end A, and a bulk of the first PMOS device P1, respectively. A gate, a drain, and a source of the second NMOS device N2 are coupled to the second control signal $\overline{OE}$, the bulk of the first PMOS device P1, and output end B, respectively. A gate, a drain, and a source of the third PMOS device P3 are coupled to the second control signal $\overline{OE}$, a first supply voltage $V_{DD}$, and the bulk of the first PMOS device P1, respectively. A gate, a drain and a source of the fourth PMOS device P4 are coupled to the first control signal OE, the input end A and the bulk of the first NMOS device N1, respectively. A gate, a drain, and a source of the third NMOS device N3 are coupled to the second control signal $\overline{OE}$, the bulk of the first NMOS device N1, and output end B, respectively. A gate, a drain, and a source of the fourth NMOS device N4 are coupled to the first control signal OE, the bulk of the first NMOS device N1, and a second supply voltage GND, respectively.

That input signal at input end A delivers to the output end B through the PMOS device P1 and the NMOS device N1 relies on on/off states of the transmission gate circuit 70 according to logical voltage of the control signal $\overline{OE}$.

When the control signal $\overline{OE}$ is at low logical voltage level (while the control signal OE is at high logical voltage level), the PMOS devices P1, P2, P4 and NMOS devices N1, N2, N3 are turned off, but the PMOS device P3 and NMOS device N4 turn on. Meanwhile, N-well of the PMOS device P1 is coupled to the first supply voltage $V_{DD}$, and P-well of the NMOS device N1 is coupled to the second supply voltage GND by means of the NMOS device N4. In this interval, the input signal at the input end A of the transmission gate circuit 70 fails to deliver to the output end B.

Figure 7:
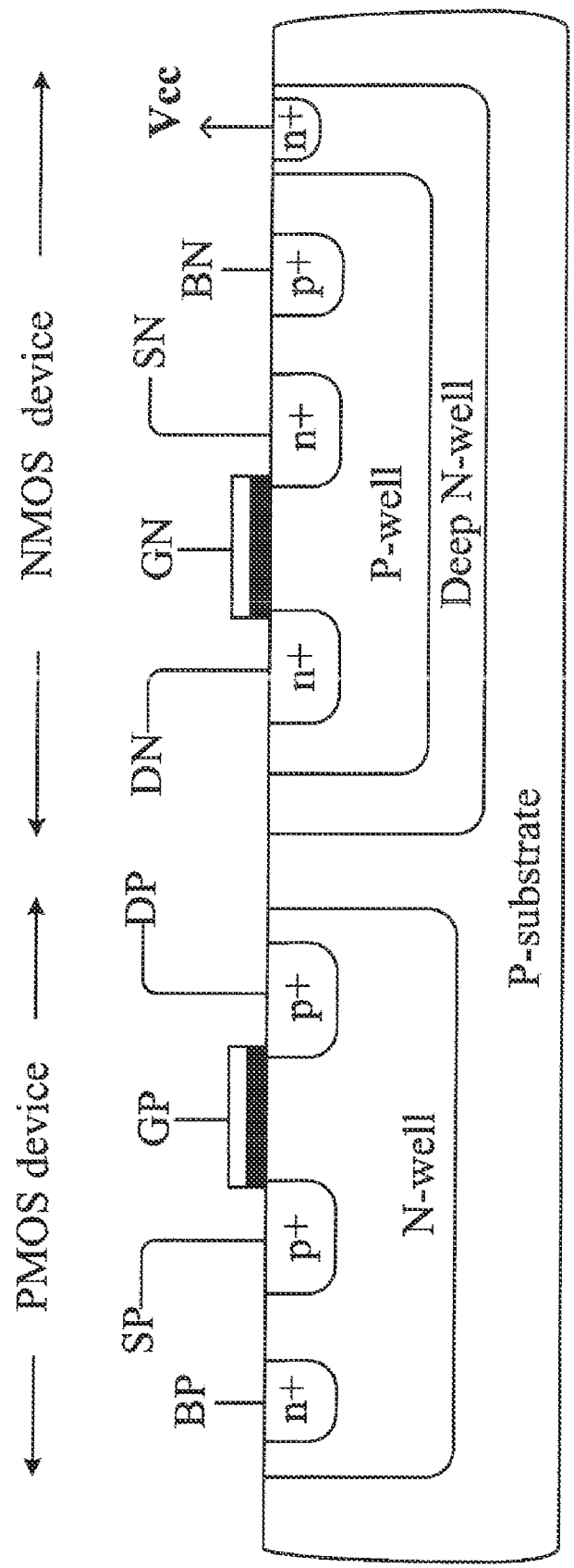
FIG. 7 shows a structure of the PMOS device and the NMOS device of the transmission gate circuits of FIGS. 6-10.

Please refer to FIG. 3 showing a signal diagram of input end A, output end B, and node P when the transmission gate circuit turns on, and FIG. 7 shows a structure of the PMOS device and the NMOS device of the transmission gate circuit 70 of FIG. 6. When the control signal $\overline{OE}$ is at high logical voltage level (while the control signal OE is at low logical voltage level), three states of the transmission gate circuit 50 happen: (A) When the input signal is at high logical voltage level, the PMOS device P3 and NMOS devices N2, N3, N4 are turned off, but the PMOS device P1 and the NMOS device N1 turns on, so that voltage of the input end A is delivered to N-well (i.e. bulk) of PMOS device P1 through the PMOS device P2, and the P-well of the NMOS device N1 is coupled to the input end A via the PMOS device P4. Therefore, voltage difference $|V_{SB}|$ between the bulk and the source of the PMOS device P1 or NMOS device N1 is too small to ignore body effects on the PMOS device P1 and the NMOS device N1.

(B) The PMOS device P3 and the NMOS device N4 turn off while the PMOS devices P1, P2, P4 and the NMOS devices N1, N2, N3 turn on, in response to a rise of the input signal from the low logical voltage level to the high logical voltage level, or a drop of the input signal from the high logical voltage level to the low logical voltage level. As a result, voltages of the input end A and the output end B are delivered to N-well (i.e. bulk) of PMOS device P1 through the PMOS device P2 and the NMOS device N2. Therefore, voltage difference $|V_{SB}|$ between the bulk and the source of the PMOS device P1 is too small to ignore body effects on the PMOS device P1. Also, voltages of the input end A and the output end B are delivered to P-well of NMOS device N1 through the PMOS device P4 and the NMOS device N3. Therefore, voltage difference $|V_{SB}|$ between the bulk and the source of the NMOS device N1 is too small to ignore body effects on the NMOS device N1.

(C) The PMOS device P2, P4 turns off whereas the PMOS devices P1 and the NMOS device N1 turn on, when the input signal is at the low logical voltage level. In this way, voltage of the output end B is delivered to N-well (i.e. bulk) of PMOS device P1 through the NMOS device N2. Therefore, voltage difference $|V_{SB}|$ between the bulk and the source of the PMOS device P1 is too small to ignore body effects on the PMOS device P1. Also, voltage of the output end B is delivered to the P-well of the NMOS device N1 via the NMOS device N3. Accordingly, voltage difference $|V_{SB}|$ between the bulk and the source of the NMOS device N1 is too small to ignore body effects on the NMOS device N1.

Consequently, during a time period of which the control signal $\overline{OE}$ is at high logical voltage level (while the control signal OE is at the low logical voltage level), the transmission gate circuit 70 is capable of reducing body effect of the PMOS device and NMOS device.

Figure 8:
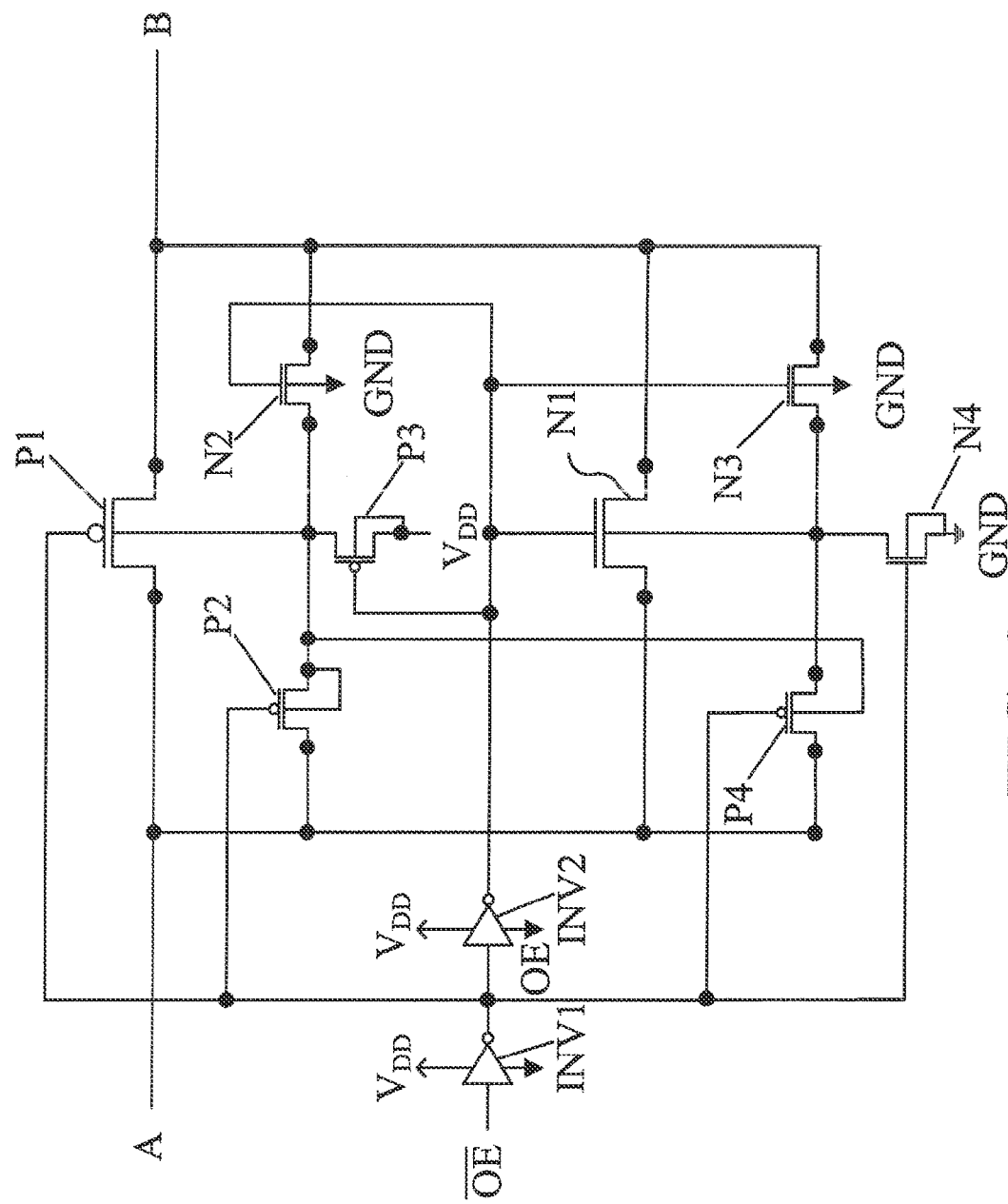
FIG. 8 illustrates a circuit diagram of the transmission gate circuit according to a fourth embodiment of the present invention.

Please refer to FIG. 8 illustrates a circuit diagram of the transmission gate circuit 80 according to a fourth embodiment of the present invention. Differing from the transmission gate circuit 70 shown in FIG. 6, the N-wells of the PMOS devices P2, P4 are coupled to N-well of the PMOS device P1 in the transmission gate circuit 80 in FIG. 8. In other words, bulks of the PMOS devices P2, P4 coupled to an N-well of the PMOS device P1 also achieve a reduction of body effect on the PMOS device P1 and NMOS device N1, accordingly.

Figure 9:
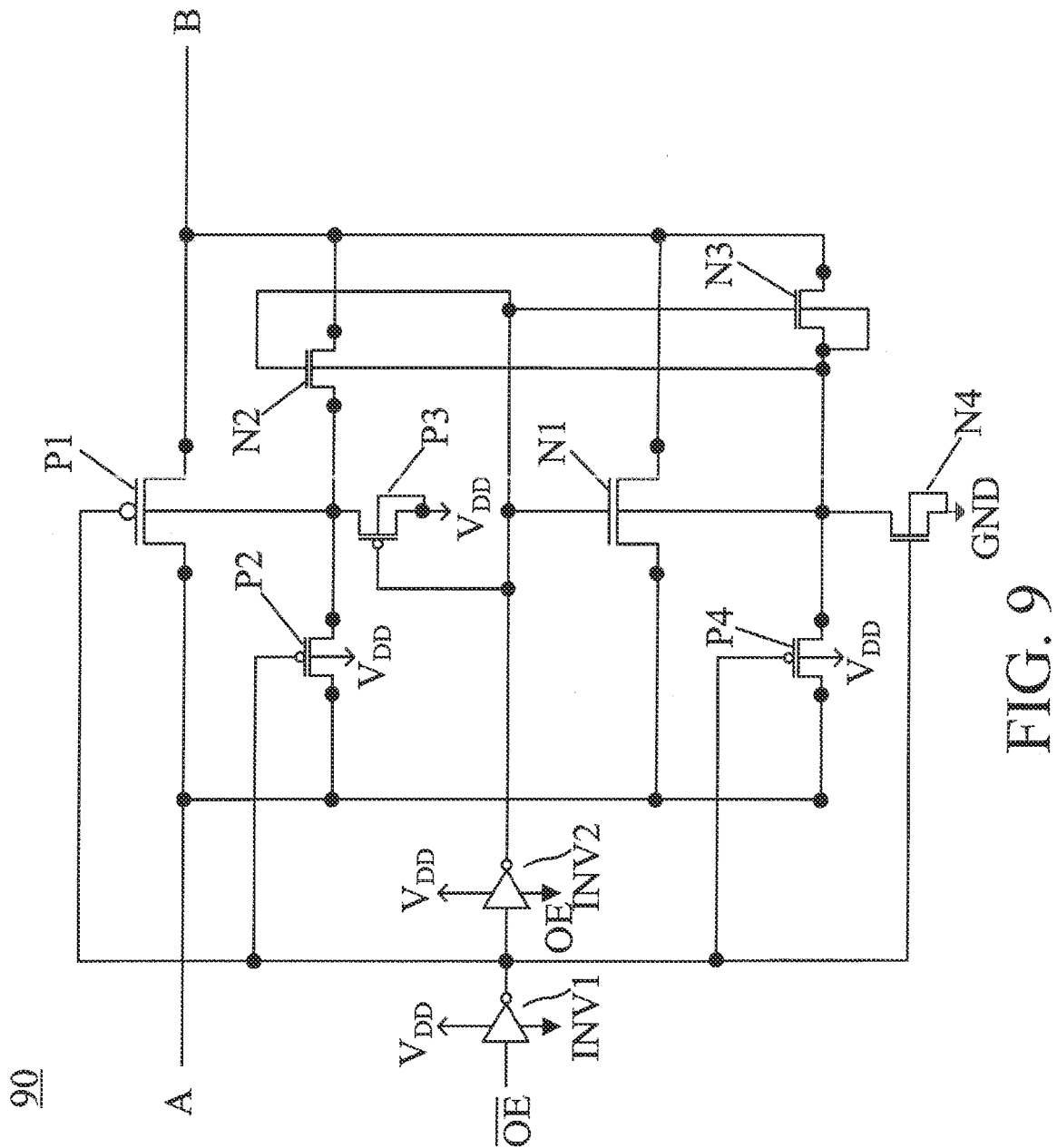
FIG. 9 illustrates a circuit diagram of the transmission gate circuit according to a fifth embodiment of the present invention.

Please refer to FIG. 9 illustrates a circuit diagram of the transmission gate circuit 90 according to a fifth embodiment of the present invention. Differing from the transmission gate circuit 70 shown in FIG. 6, the P-wells of the NMOS devices N2, N3 are coupled to P-well of the NMOS device N1 in the transmission gate circuit 90 in FIG. 9. In other words, bulks of the NMOS devices N2, N3 coupling to a P-well of the NMOS device N1 also achieve a reduction of body effect on the PMOS device P1 and NMOS device N1, accordingly.

Figure 10:
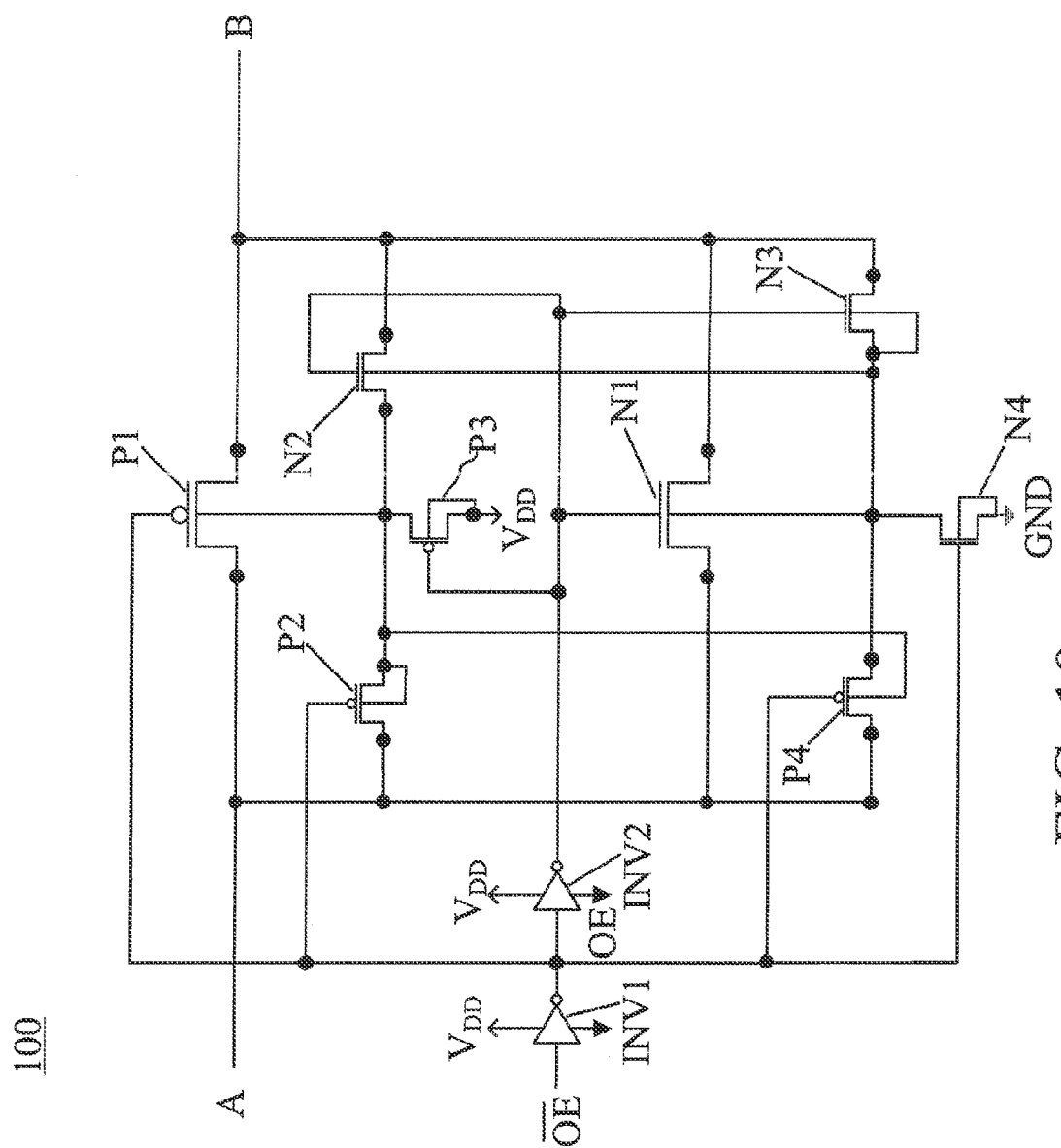
FIG. 10 illustrates a circuit diagram of the transmission gate circuit according to a sixth embodiment of the present invention.

Please refer to FIG. 10 illustrates a circuit diagram of the transmission gate circuit 100 according to a sixth embodiment of the present invention. Differing from the transmission gate circuit 70 shown in FIG. 6, the N-wells of the PMOS devices P2, P4 are coupled to N-well of the PMOS device P1. Also, the P-wells of the NMOS devices N2, N3 are coupled to P-well of the NMOS device N1 in the transmission gate circuit 90 in FIG. 9. In other words, not only bulks of the NMOS devices N2, N3 coupling to a P-well of the NMOS device N1, but also bulks of the PMOS devices P2, P4 coupling to an N-well of the PMOS device P1 achieve a reduction of body effect on the PMOS device P1 and NMOS device N1, accordingly.

In contrast to prior art, the present inventive transmission gate circuit utilizes a circuit coupling bulks of the PMOS and NMOS devices, capable of compensating body effects on the PMOS and NMOS devices of the conventional transmission gate. Consequently, regardless of dealing with digital or analog signal, a voltage difference between a source and a bulk of the PMOS or the NMOS devices of the inventive transmission gate is closes to zero, preventing damage on circuit characteristic from body effect.

Although the present invention has been explained by the embodiments shown in the drawings described above, it should be understood to the ordinary skilled person in the art that the invention is not limited to the embodiments, but rather various changes or modifications thereof are possible without departing from the spirit of the invention. Accordingly, the scope of the invention shall be determined only by the appended claims and their equivalents.

What is claimed is:

1. A transmission gate comprising:
    a first PMOS device, of which a gate, a drain, and a source are coupled to a first control signal, an input end, and an output end, respectively;
    a first NMOS device, of which a gate, a drain, and a source are coupled to a second control signal, the input end, and the output end, respectively;
    a second PMOS device, of which a gate, a drain, and a source are coupled to the first control signal OE, the input end, and a bulk of the first PMOS device, respectively;
    a second NMOS device, of which a gate, a drain, and a source are coupled to the second control signal, the bulk of the first PMOS device, and output end, respectively; and
    a third PMOS device, of which a gate, a drain, and a source are coupled to the second control signal, a first supply voltage, and the bulk of the first PMOS device, respectively.

2. The transmission gate circuit as claimed in claim 1, wherein both the source and a bulk of the second PMOS device are coupled.

3. The transmission gate circuit as claimed in claim 1, further comprising:
    a fourth PMOS device, of which a gate, a drain and a source are coupled to the first control signal, the input end and a bulk of the first NMOS device, respectively;
    a third NMOS device, of which a gate, a drain, and a source of the third NMOS device are coupled to the second control signal, the bulk of the first NMOS device, and output end B, respectively; and
    a fourth NMOS device, of which a gate, a drain, and a source of the fourth NMOS device are coupled to the first control signal, the bulk of the first NMOS device N1, and a second supply voltage, respectively.

4. The transmission gate circuit as claimed in claim 3, wherein both the source and a bulk of the second PMOS device are coupled, and a bulk of the fourth PMOS device is coupled to the bulk of the second PMOS device.

5. The transmission gate circuit as claimed in claim 3, wherein a bulk of the second NMOS device, the drain and a bulk of the third NMOS device are coupled to a bulk of the first NMOS device.

6. The transmission gate circuit as claimed in claim 3, wherein a bulk of the fourth PMOS device, a source and a bulk of the second PMOS device are coupled to the bulk of the first PMOS device.

7. The transmission gate circuit as claimed in claim 6, wherein the first control signal and the second control signal have different phases by 180 degrees.

* * * * *